US007651583B2

(12) United States Patent
Kent et al.

(10) Patent No.: US 7,651,583 B2
(45) Date of Patent: Jan. 26, 2010

(54) PROCESSING SYSTEM AND METHOD FOR TREATING A SUBSTRATE

(75) Inventors: Martin Kent, Andover, MA (US); Arthur H Laflamme, Jr., Rowley, MA (US); Jay Wallace, Danvers, MA (US); Thomas Hamelin, Georgetown, MA (US)

(73) Assignee: Tokyo Electron Limited, Tokyo (JP)

( * ) Notice: Subject to any disclaimer, the term of this patent is extended or adjusted under 35 U.S.C. 154(b) by 205 days.

(21) Appl. No.: 10/860,149

(22) Filed: Jun. 4, 2004

(65) Prior Publication Data

US 2005/0269030 A1    Dec. 8, 2005

(51) Int. Cl.
*C23F 1/00* (2006.01)
*H01L 21/306* (2006.01)
*C23C 16/00* (2006.01)

(52) U.S. Cl. .............................. 156/345.31; 156/345.51; 156/345.52; 156/345.54; 118/719; 118/724; 118/725; 118/728; 118/729; 118/733

(58) Field of Classification Search ............ 156/345.31, 156/345.32; 118/719; 414/939
See application file for complete search history.

(56) References Cited

U.S. PATENT DOCUMENTS

| | | | | |
|---|---|---|---|---|
| 5,186,120 | A | * | 2/1993 | Ohnishi et al. .............. 118/667 |
| 6,276,072 | B1 | * | 8/2001 | Morad et al. .................. 34/428 |
| 6,302,966 | B1 | * | 10/2001 | Bailey et al. ................. 118/724 |
| 6,352,623 | B1 | | 3/2002 | Volodarsky et al. |
| 6,409,837 | B1 | * | 6/2002 | Hillman ....................... 118/712 |
| 6,951,821 | B2 | * | 10/2005 | Hamelin et al. .............. 438/706 |
| 7,029,536 | B2 | * | 4/2006 | Hamelin et al. .............. 118/715 |
| 7,097,760 | B1 | * | 8/2006 | Kalnes et al. ................ 208/108 |
| 7,214,274 | B2 | * | 5/2007 | Wallace et al. .............. 118/719 |
| 7,462,564 | B2 | * | 12/2008 | Hamelin et al. .............. 438/706 |
| 2005/0211386 | A1 | * | 9/2005 | Hamelin et al. ......... 156/345.52 |
| 2009/0226633 | A1 | * | 9/2009 | LaFlamme et al. ........... 427/532 |

FOREIGN PATENT DOCUMENTS

| | | | | |
|---|---|---|---|---|
| JP | 10050716 | A | * | 2/1998 |
| JP | 10092916 | A | * | 4/1998 |
| JP | 2000077506 | A | * | 3/2000 |
| WO | WO 9720340 | A1 | * | 6/1997 |

* cited by examiner

*Primary Examiner*—Karla Moore

(57) ABSTRACT

A processing system and method for chemical oxide removal, wherein the processing system includes a process chamber having a lower chamber portion configured to chemically treat a substrate and an upper chamber portion configured to thermally treat the substrate, and a substrate lifting assembly configured to transport the substrate between the lower chamber portion and the upper chamber portion. The lower chamber portion includes a chemical treatment environment that provides a temperature controlled substrate holder for supporting the substrate for chemical treatment. The substrate is exposed to a gaseous chemistry, such as $HF/NH_3$, under controlled conditions including surface temperature and gas pressure. The upper chamber portion includes a thermal treatment environment that provides a heating assembly configured to elevate the temperature of the substrate.

21 Claims, 9 Drawing Sheets

US 7,651,583 B2

PROCESSING SYSTEM AND METHOD FOR TREATING A SUBSTRATE

BACKGROUND OF THE INVENTION

1. Cross-Reference to Related Applications

This application is related to pending U.S. patent application Ser. No. 10/705,201, entitled "Processing System and Method For Treating a Substrate", filed on Nov. 12, 2003; pending U.S. patent application Ser. No. 10/705,200, entitled "Processing System and Method For Chemically Treating a Substrate", filed on Nov. 12, 2003; pending U.S. patent application Ser. No. 10/704,969, entitled "Processing System and Method For Thermally Treating a Substrate", filed on Nov. 12, 2003; pending U.S. patent application Ser. No. 10/705,397, entitled "Method and Apparatus For Thermally Insulating Adjacent Temperature Controlled Chambers", filed on Nov. 12, 2003; pending U.S. patent application Ser. No. 10/812,347, entitled "Processing System and Method For Treating a Substrate", filed on Mar. 30, 2004; and co-pending U.S. patent application Ser. No. 10/859,975, entitled "Method of Operating a Processing System for Treating a Substrate", filed on even date herewith. The entire contents of all of those applications are herein incorporated by reference in their entirety.

2. Field of the Invention

The present invention relates to a system and method for treating a substrate, and more particularly to a system and method for chemical and thermal treatment of a substrate.

3. Description of the Related Art

During semiconductor processing, a (dry) plasma etch process can be utilized to remove or etch material along fine lines or within vias or contacts patterned on a silicon substrate. The plasma etch process generally involves positioning a semiconductor substrate with an overlying patterned, protective layer, for example a photoresist layer, in a processing chamber. Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a fraction of the gas species present are ionized by electrons heated via the transfer of radio frequency (RF) power either inductively or capacitively, or microwave power using, for example, electron cyclotron resonance (ECR).

Moreover, the heated electrons serve to dissociate some species of the ambient gas species and create reactant specie(s) suitable for the exposed surface etch chemistry. Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, gates, etc.) in the selected regions of the substrate. Such substrate materials where etching is required include silicon dioxide ($SiO_2$), low-k dielectric materials, poly-silicon, and silicon nitride.

During material processing, etching such features generally comprises the transfer of a pattern formed within a mask layer to the underlying film within which the respective features are formed. The mask can, for example, comprise a light-sensitive material such as (negative or positive) photoresist, multiple layers including such layers as photo-resist and an anti-reflective coating (ARC), or a hard mask formed from the transfer of a pattern in a first layer, such as photoresist, to the underlying hard mask layer.

SUMMARY OF THE INVENTION

The present invention relates to a system and method for treating a substrate, and to a system and method for chemically and thermally treating a substrate.

In one embodiment of the invention, a processing system for trimming a feature on a substrate is presented comprising: a process chamber having a lower chamber portion for chemically altering exposed surface layers on the substrate, and an upper chamber portion for thermally treating the chemically altered surface layers on the substrate, and a substrate lifting assembly coupled to the process chamber, configured to transport the substrate between the lower chamber portion and the upper portion.

Additionally, in another embodiment of the invention, a method of operating a processing system to trim a feature on a substrate is presented comprising: transferring the substrate into a lower chamber portion of a process chamber; chemically treating the substrate in the lower chamber portion in order to chemically alter exposed surface layers on the substrate; transferring the substrate from the lower chamber portion to an upper chamber portion of the process chamber; and thermally treating the substrate in the upper chamber portion in order to desorb the chemically altered surface layers.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF SEVERAL EMBODIMENTS

In material processing methodologies, pattern etching comprises the application of a thin layer of light-sensitive material, such as photoresist, to an upper surface of a substrate, that is subsequently patterned in order to provide a mask for transferring this pattern to the underlying thin film during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photoresist), or non-irradiated regions (as in the case of negative resist) using a developing solvent.

Additionally, multi-layer and hard masks can be implemented for etching features in a thin film. For example, when etching features in a thin film using a hard mask, the mask pattern in the light-sensitive layer is transferred to the hard mask layer using a separate etch step preceding the main etch step for the thin film. The hard mask can, for example, be selected from several materials for silicon processing, including, but not limited to, silicon dioxide ($SiO_2$), silicon nitride ($Si_3N_4$), or carbon.

In order to reduce the feature size formed in the thin film, the hard mask can be trimmed laterally using, for example, a two-step process involving a chemical treatment of the exposed surfaces of the hard mask layer in order to alter the surface chemistry of the hard mask layer, and a post treatment of the exposed surfaces of the hard mask layer in order to desorb the altered surface chemistry.

Figure 1A:
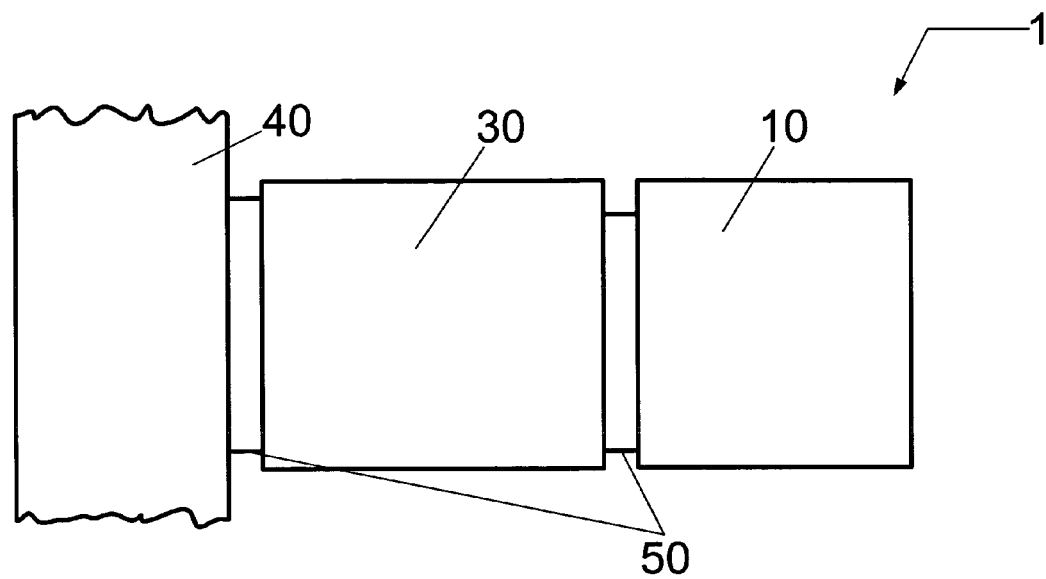
FIG. 1A illustrates a schematic representation of a plan view of a transfer system for a processing system according to an embodiment of the invention.
Figure 1B:
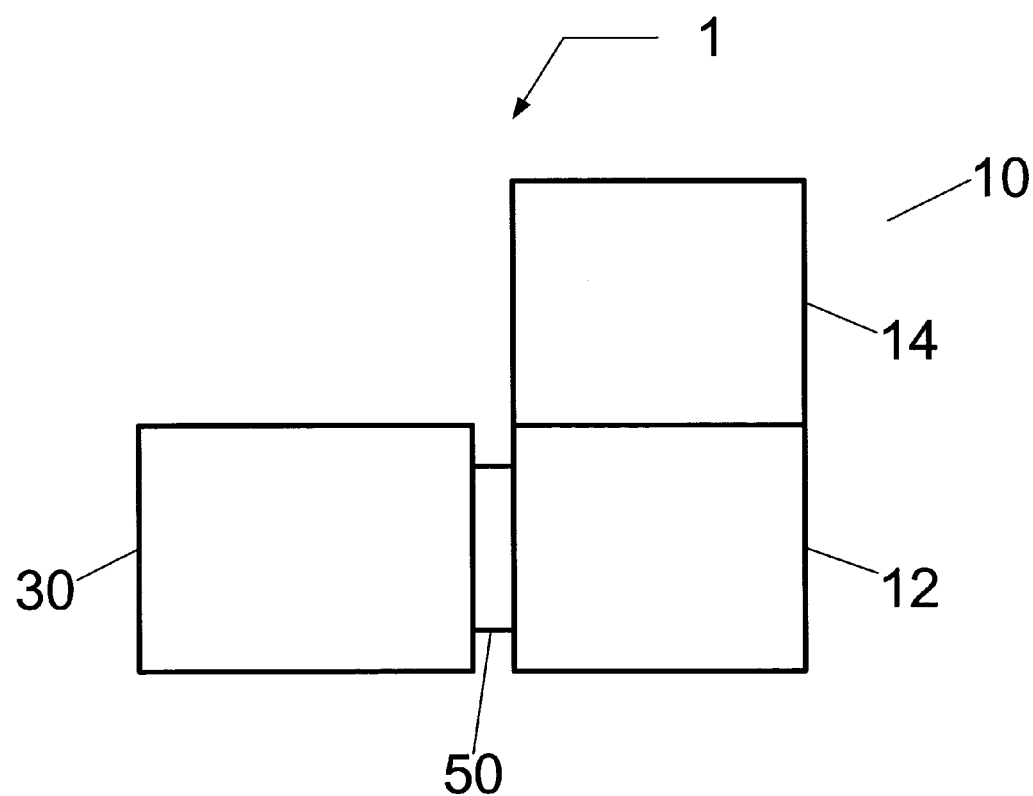
FIG. 1B illustrates a schematic representation of a side view of a transfer system for a processing system according to another embodiment of the invention.

According to one embodiment, FIGS. 1A and 1B present a plan view and a side view, respectively, of a processing system 1 for processing a substrate using, for example, mask layer trimming. The processing system 1 comprises a treatment system 10 having a lower chamber portion 12 and an upper chamber portion 14 (see FIG. 1B). For example, the treatment system 10 can be configured to perform a chemical treatment of a substrate in the lower chamber portion 12, and a thermal treatment of the substrate in the upper chamber portion 14. Also, as illustrated in FIG. 1A, a transfer system 30 can be coupled to the treatment system 10 in order to transfer substrates into and out of the treatment system 10, and exchange substrates with a multi-element manufacturing system 40.

The treatment system 10, and the transfer system 30, can, for example, comprise a processing element within the multi-element manufacturing system 40. For example, the multi-element manufacturing system 40 can permit the transfer of substrates to and from processing elements including such devices as etch systems, deposition systems, coating systems, patterning systems, metrology systems, etc. In order to isolate the processes occurring in the treatment system from the transfer system 30, an isolation assembly 50 can be utilized to couple each system. For instance, the isolation assembly 50 can comprise at least one of a thermal insulation assembly to provide thermal isolation, and a gate valve assembly to provide vacuum isolation.

Figure 1C:
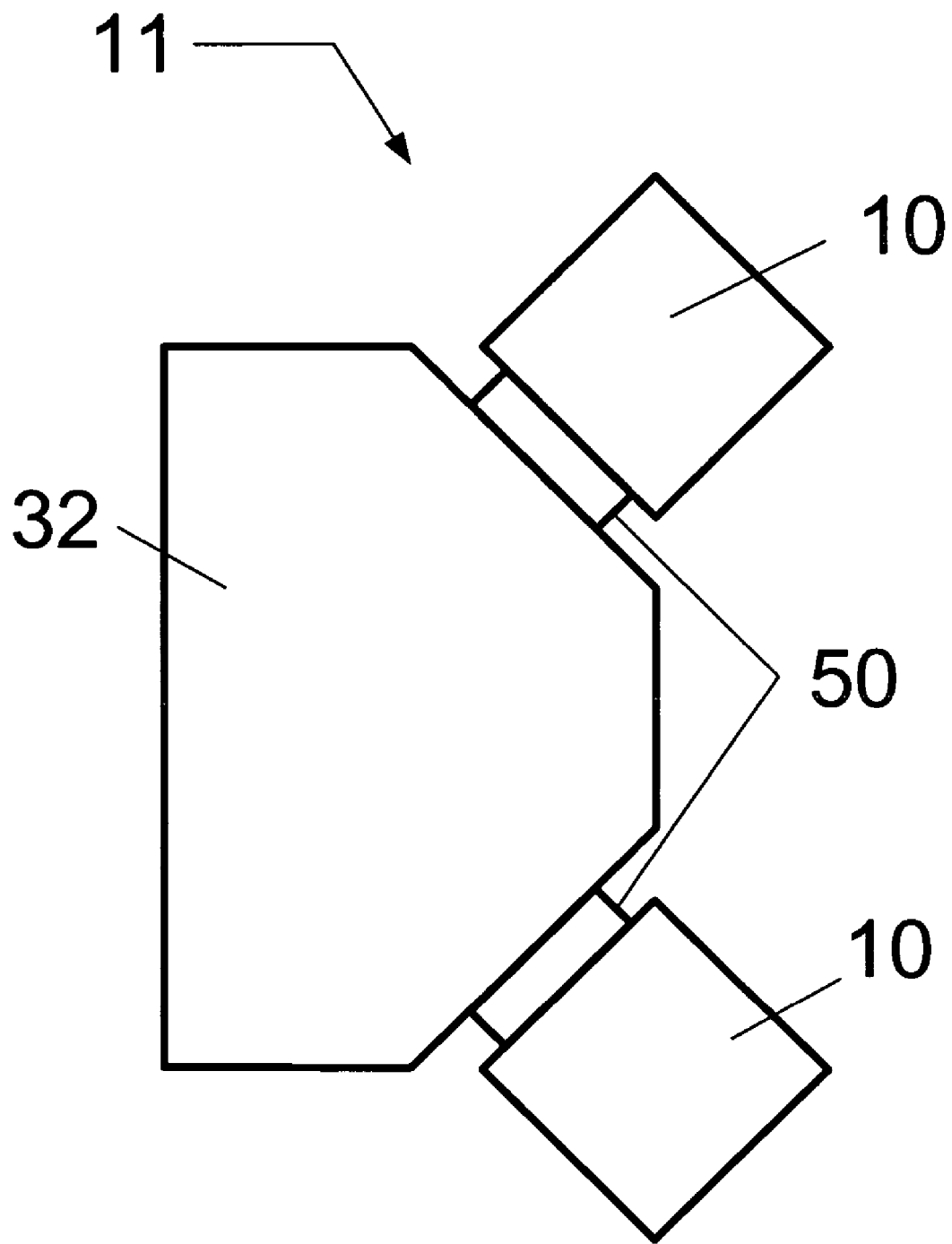
FIG. 1C illustrates a schematic representation of a plan view of a transfer system for a processing system according to another embodiment of the invention.

Alternately, in another embodiment, FIG. 1C presents a processing system 11 for processing a substrate using a process such as mask layer trimming. The processing system 11 comprises one or more treatment systems 10 having a lower chamber portion 12 and an upper chamber portion 14 (see FIG. 1B). However, the treatment systems 10 are coupled to a transfer system 32 in a cluster-tool arrangement. In order to isolate the processes occurring in the treatment system from the transfer system 32, an isolation assembly 50 can be utilized to couple each system. For instance, the isolation assembly 50 can comprise at least one of a thermal insulation assembly to provide thermal isolation, and a gate valve assembly to provide vacuum isolation.

Figure 2A:
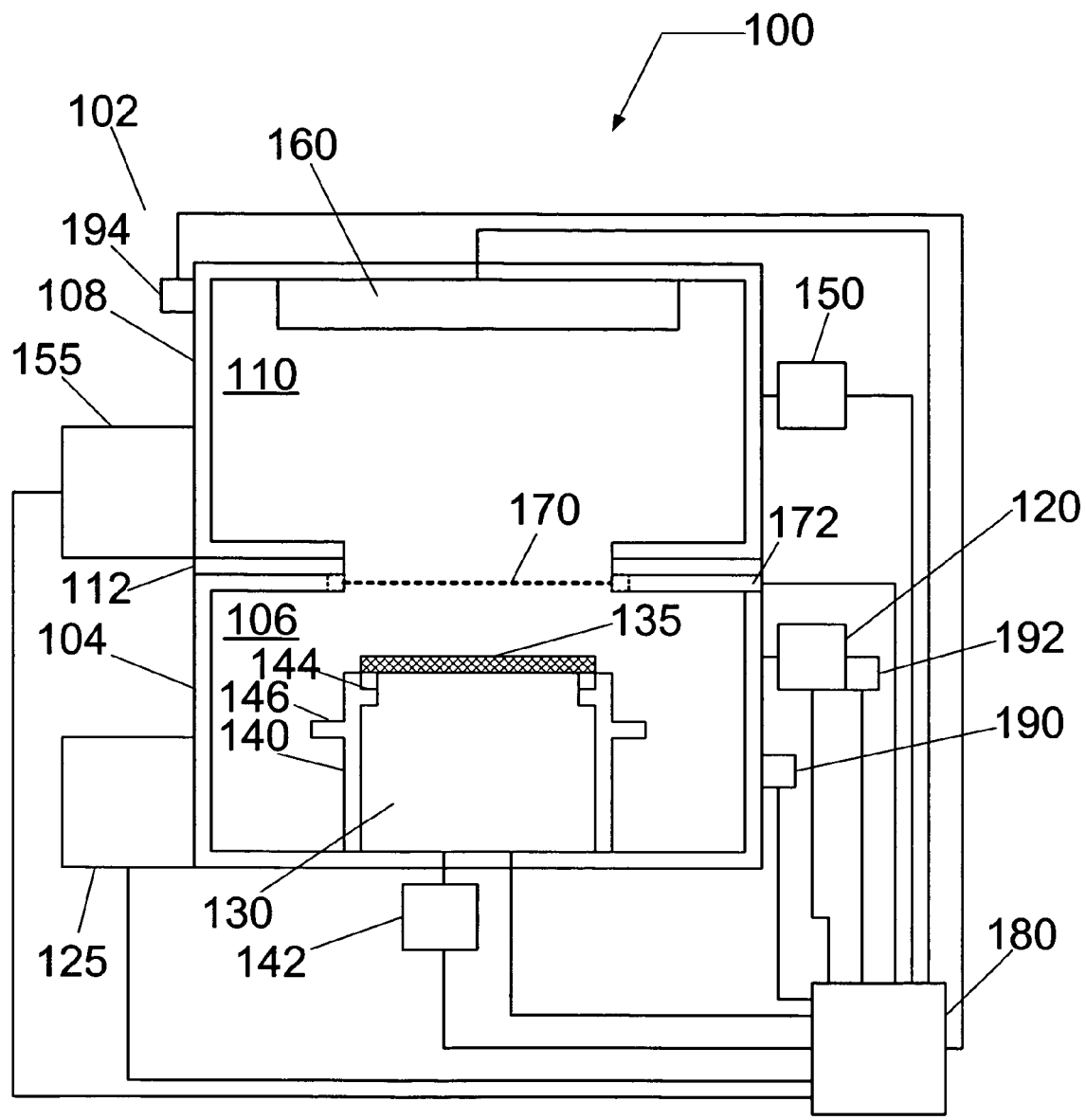
FIGS. 2A and 2B show a schematic cross-sectional view of a processing system according to an embodiment of the invention.
Figure 2B:
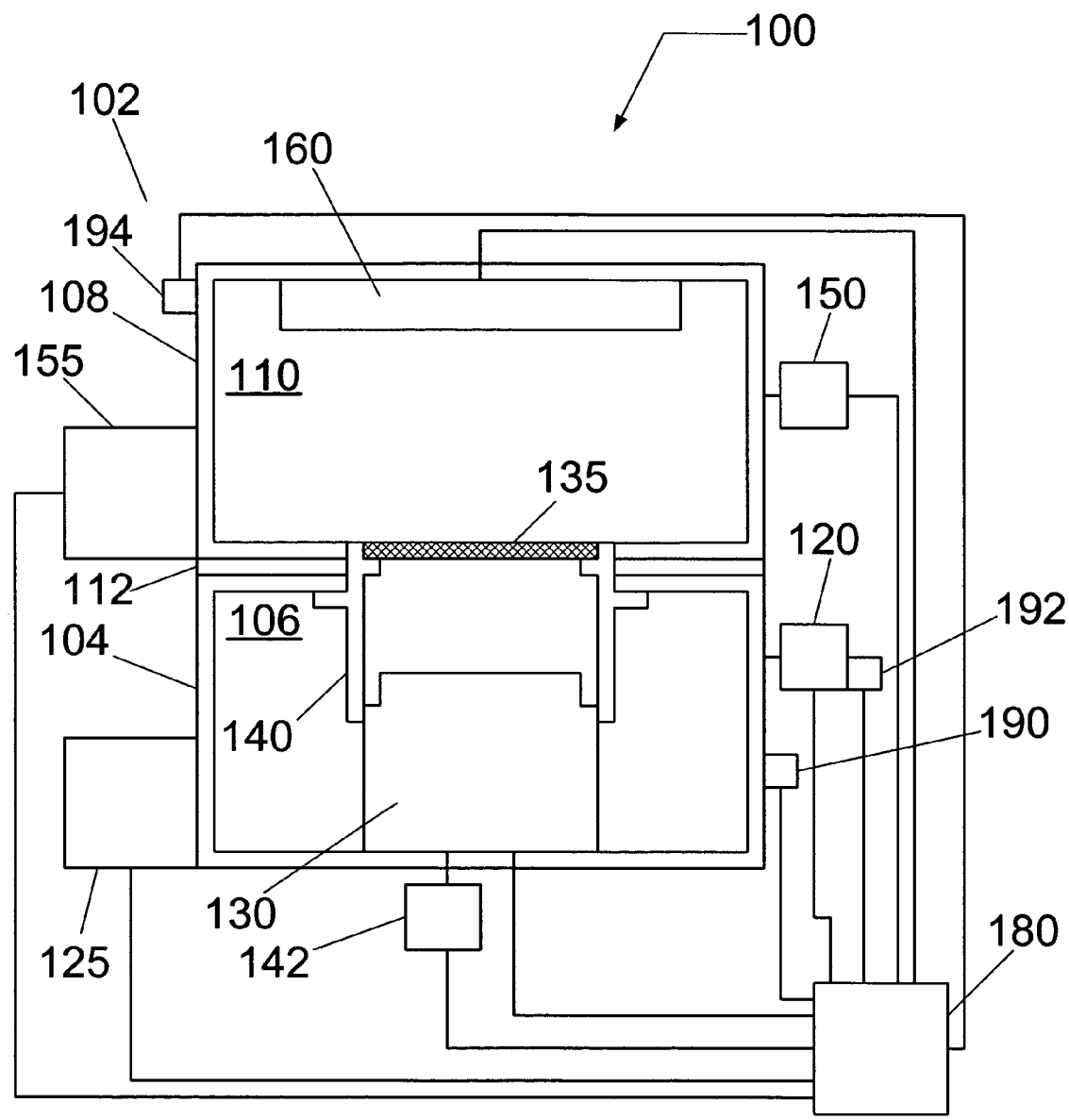

Referring now to FIGS. 2A and 2B, a processing system 100 for performing chemical treatment and thermal treatment of a substrate is presented. Processing system 100 comprises a process chamber 102 having a lower chamber portion 104 for chemically treating a substrate 135 in a chemical treatment space 106, and an upper chamber portion 108 for thermally treating the substrate 135 in a thermal treatment space 110. The lower chamber portion 104 can be temperature-controlled, and the upper chamber portion 108 can be temperature-controlled. The lower chamber portion 104 and upper chamber portion 108 can be thermally insulated from one another using a thermal insulation assembly 112. Additionally, the lower chamber portion 104 and the upper chamber portion 108 can be vacuum isolated from one another using an optional vacuum isolation assembly, such as gate valve 170 and valve drive system 172 (as shown in FIG. 2A).

Referring now to FIG. 2A, the lower chamber portion 104 includes a substrate holder 130 configured to support substrate 135. The substrate holder 130 can be configured to heat, cool, or control the temperature of substrate 135. Coupled to substrate holder 130, a substrate lifting assembly 140 is configured to raise and lower substrate 135 from the upper surface of substrate holder 130 using translation drive system 142. Additionally, the lower chamber portion 104 further includes a gas injection system 120 for introducing one or more process gases to the chemical treatment space 106 in the lower chamber portion 104 in order to chemically treat substrate 135, and a pumping system 125 for evacuating the lower chamber portion 104.

Referring still to FIG. 2A, the upper chamber portion 108 includes a heating assembly 160, such as a radiant heating assembly to be discussed in greater detail below, for elevating the temperature of substrate 135. Additionally, the upper chamber portion 108 further includes a gas purge system 150 for introducing purge gas to the thermal treatment space 110 in the upper chamber portion 108, and a pumping system 155 for evacuating the upper chamber portion 108.

Additionally, as shown in FIGS. 2A and 2B, the processing system 100 further includes a controller 180 coupled to the processing system, and configured to control the processing system.

Additionally, the processing system 100 further includes a transfer opening (not shown) through which a substrate can be transferred. During processing, the transfer opening can be sealed closed using a gate valve assembly in order to prevent, for example, contamination between the processing system and other systems, such as a transfer system. For example, although not shown, the transfer opening can be formed in the lower chamber portion 104 of process chamber 102.

As described above, a film layer on substrate 135 can be trimmed using, for example, a two-step process involving a chemical treatment of the exposed surfaces of the film layer in order to alter the surface chemistry of the film layer, and a thermal treatment of the exposed surfaces of the film layer in order to desorb the altered surface chemistry. As illustrated in FIG. 1A, substrate lifting assembly 140 can be lowered to its chemical treatment position, wherein substrate 135 is coupled to the upper surface of substrate holder 130. During this period of time, the lower chamber portion 104 can be thermally insulated from the upper chamber portion 108 via thermal insulation assembly 112, and it can optionally be vacuum isolated from the upper chamber portion 108 via gate valve 170. One or more process gases can be introduced for chemically treating substrate 135 using gas injection system 120, and the lower chamber portion 104 can be evacuated using pumping system 125. Once the chemical treatment process is complete, the substrate lifting assembly 140 can be elevated to its thermal treatment position as shown in FIG. 2B. Therein, the substrate lifting assembly captures substrate 135 with substrate lip 144, raises substrate 135 from the lower chamber portion 104 to the upper chamber portion 108, and isolates the lower chamber portion 104 from the upper chamber portion 108 via chamber lip 146.

Figure 3:
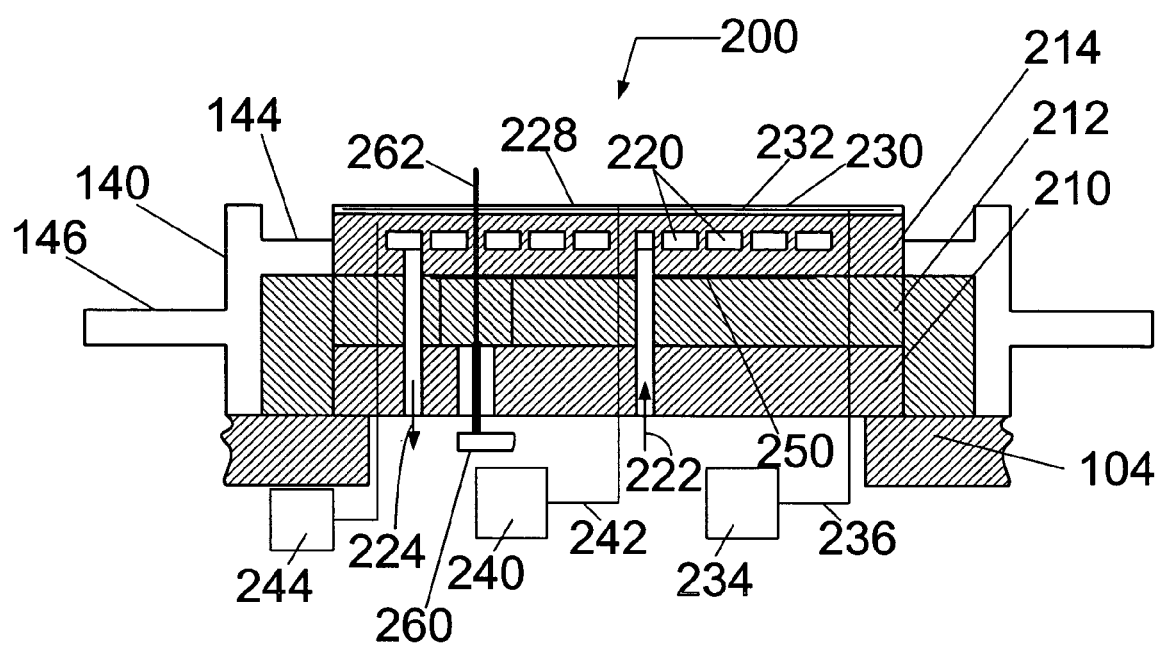
FIG. 3 shows a schematic cross-sectional view of a substrate holder according to an embodiment of the invention.

As illustrated in FIG. 3, the lower chamber portion 104 comprises a substrate holder 130 configured to provide several operational functions for thermally controlling and processing substrate 135. The substrate holder 130 can comprise an electrostatic clamping system (or mechanical clamping system) in order to electrically (or mechanically) clamp substrate 135 to the substrate holder 130. Furthermore, substrate holder 130 can, for example, further include a cooling system having a re-circulating coolant flow that receives heat from substrate holder 130 and transfers heat to a heat exchanger system (not shown), or when heating, transfers heat from the heat exchanger system.

Moreover, a heat transfer gas can, for example, be delivered to the back-side of substrate 135 via a backside gas system to improve the gas-gap thermal conductance between substrate 135 and substrate holder 130. For instance, the heat transfer gas supplied to the back-side of substrate 135 can comprise an inert gas such as helium, argon, xenon, krypton, a process gas, or other gas such as oxygen, nitrogen, or hydrogen. Such a system can be utilized when temperature control of the substrate is required at elevated or reduced temperatures. For example, the backside gas system can comprise a multi-zone gas distribution system such as a two-zone (center-edge) system, wherein the back-side gas gap pressure can be independently varied between the center and the edge of substrate 135. In other embodiments, heating/cooling elements, such as resistive heating elements, or thermo-electric heaters/coolers can be included in the substrate holder 130, as well as the chamber wall of the lower chamber portion 104 of process chamber 102.

For example, FIG. 3 presents a temperature controlled substrate holder 200 for performing several of the above-identified functions. Substrate holder 200 comprises a chamber mating component 210 coupled to a lower wall of the lower chamber portion 104 of process chamber 102, an insulating component 212 coupled to the chamber mating component 210, and a temperature control component 214 coupled to the insulating component 212. The chamber mating and temperature control components 210, 214 can, for example, be fabricated from an electrically and thermally conducting material such as aluminum, stainless steel, nickel, etc. The insulating component 212 can, for example, be fabricated from a thermally-resistant material having a relatively lower thermal conductivity such as quartz, alumina, Teflon, etc.

The temperature control component 214 can comprise temperature control elements such as cooling channels, heating channels, resistive heating elements, or thermoelectric elements. For example, as illustrated in FIG. 3, the temperature control component 214 comprises a coolant channel 220 having a coolant inlet 222 and a coolant outlet 224. The coolant channel 220 can, for example, be a spiral passage within the temperature control component 214 that permits a flow rate of coolant, such as water, Fluorinert, Galden HT-135, etc., in order to provide conductive-convective cooling of the temperature control component 214. Alternately, the coolant channel 220 can be zoned into two or more coolant zones, wherein each zone is independently controlled.

Moreover, the temperature control component 214 can comprise an array of thermoelectric elements capable of heating or cooling a substrate depending upon the direction of electrical current flow through the respective elements. An exemplary thermoelectric element is one commercially available from Advanced Thermoelectric, Model ST-127-1.4-8.5M (a 40 mm by 40 mm by 3.4 mm thermo-electric device capable of a maximum heat transfer power of 72 W).

Additionally, the substrate holder 200 can further comprise an electrostatic clamp (ESC) 228 comprising a ceramic layer 230, a clamping electrode 232 embedded therein, and a high-voltage (HV) DC voltage supply 234 coupled to the clamping electrode 232 using an electrical connection 236. The ESC 228 can, for example, be mono-polar, or bi-polar. The design and implementation of such a clamp is well known to those skilled in the art of electrostatic clamping systems.

Additionally, the substrate holder 200 can further comprise a backside gas supply system 240 for supplying a heat transfer gas, such as an inert gas including, but not limited to, helium, argon, xenon, krypton, a process gas, or other gas including oxygen, nitrogen, or hydrogen, to the backside of substrate 135 through at least one gas supply line 242, and at least one of a plurality of orifices and channels. The backside gas supply system 240 can, for example, be a multi-zone supply system such as a two-zone (center-edge) system, wherein the backside pressure can be varied radially from the center to the edge.

The insulating component 212 can further comprise a thermal insulation gap 250 in order to provide additional thermal insulation between the temperature control component 214 and the underlying mating component 210. The thermal insulation gap 250 can be evacuated using a pumping system (not shown) or a vacuum line as part of vacuum pumping system 250, and/or coupled to a gas supply (not shown) in order to vary its thermal conductivity. The gas supply can, for example, be the backside gas supply 340 utilized to couple heat transfer gas to the back-side of the substrate 135.

The mating component 210 can further comprise a lift pin assembly 260 capable of raising and lowering three or more lift pins 262 in order to vertically translate substrate 135 to and from an upper surface of the substrate holder 200 and a transfer plane in the processing system.

Each component 210, 212, and 214 further comprises fastening devices (such as bolts and tapped holes) in order to affix one component to another, and to affix the substrate holder 200 to the lower chamber portion 104. Furthermore, each component 210, 212, and 214 facilitates the passage of the above-described utilities to the respective component, and vacuum seals, such as elastomer O-rings, are utilized where necessary to preserve the vacuum integrity of the processing system.

The temperature of the temperature-controlled substrate holder 200 can be monitored using a temperature sensing device 244 such as a thermocouple (e.g. a K-type thermocouple, Pt sensor, etc.). Furthermore, a controller can utilize the temperature measurement as feedback to the chemical treatment process in order to control the temperature of substrate holder 200. For example, at least one of a fluid flow rate, fluid temperature, heat transfer gas type, heat transfer gas pressure, clamping force, resistive heater element current or voltage, and thermoelectric device current or polarity, etc. can be adjusted in order to affect a change in the temperature of substrate holder 200 and/or the temperature of the substrate 135.

Referring again to FIGS. 2A and 2B, the lower chamber portion 104 comprises gas injection system 120. The gas injection system 120 can include one or more gas injection orifices, one or more gas injection plenums for supplying process gas to the one or more gas injection orifices, and a gas supply system. For example, the gas injection system 120 can be configured to supply process gas comprising one or more gases. The process gas can, for example, comprise a variety of gases including, but not limited to, $NH_3$, HF, $H_2$, $O_2$, CO, $CO_2$, Ar, He, etc.

Referring again to FIGS. 2A and 2B, the lower chamber portion 104 can include a temperature controlled wall that is maintained at an elevated temperature. For example, a wall heating element can be coupled to a lower wall temperature control unit 190, and the wall heating element can be configured to couple to the lower chamber portion 104. The heating element can, for example, comprise a resistive heater element such as a tungsten filament, nickel-chromium alloy filament, aluminum-iron alloy filament, aluminum nitride filament, etc. Examples of commercially available materials to fabricate resistive heating elements include Kanthal, Nikrothal, and Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe).

When an electrical current flows through the filament, power is dissipated as heat, and, therefore, the lower wall temperature control unit 190 can, for example, comprise a controllable DC power supply. For example, a wall heating element can comprise at least one Firerod cartridge heater commercially available from Watlow (1310 Kingsland Dr., Batavia, Ill., 60510). A cooling element can also be employed in the lower chamber portion. The temperature of the lower chamber portion 104 can be monitored using a temperature-sensing device such as a thermocouple (e.g., a K-type thermocouple, Pt sensor, etc.). Furthermore, a controller can utilize the temperature measurement as feedback to the lower wall temperature control unit 190 in order to control the temperature of the lower chamber portion 104.

Additionally, referring to FIGS. 2A and 2B, the gas injection system 120 of lower chamber portion 104 can further comprise a temperature controlled gas distribution system that can be maintained at any selected temperature. For example, a gas distribution heating element can be coupled to a gas distribution system temperature control unit 192, and the gas distribution heating element can be configured to couple to the gas distribution system 120. The heating element can, for example, comprise a resistive heater element such as a tungsten, nickel-chromium alloy, aluminum-iron alloy, aluminum nitride, etc., filament. Examples of commercially available materials to fabricate resistive heating elements include Kanthal, Nikrothal, and Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). When an electrical current flows through the filament, power is dissipated as heat, and, therefore, the gas distribution system temperature control unit 192 can, for example, comprise a controllable DC power supply. For example, gas distribution heating element can comprise a silicone rubber heater (about 1 mm thick) capable of about 1400 W (or power density of about 5 W/in$^2$). The temperature of the gas distribution system 120 can be monitored using a temperature-sensing device such as a thermocouple (e.g. a K-type thermocouple, Pt sensor, etc.). Furthermore, a controller can utilize the temperature measurement as feedback to the gas distribution system temperature control unit 192 in order to control the temperature of the gas distribution system 120. Alternatively, or in addition, cooling elements can be employed in any of the embodiments.

Additionally, referring to FIGS. 2A and 2B, processing system 100 includes heating assembly 160 coupled to the upper chamber portion 108, and configured to heat substrate 135 when it is in a raised position (thermal treatment position), as shown in FIG. 2B. As described earlier, the heating assembly 160 can include a radiant heating assembly and, more specifically, it can include an array of radiant lamps. For example, the array of lamps can include an array of tungsten-halogen lamps. When turned on, the array of radiant lamps can elevate the temperature of substrate 135 to a point (e.g., about 100 to about 150° C.) sufficient to desorb the altered surface chemistry.

Additionally, referring again to FIGS. 2A and 2B, the upper chamber portion 108 comprises gas purge system 150. The gas purge system 150 can include one or more gas injection orifices, one or more gas injection plenums for supplying purge gas to the one or more gas injection orifices, and a gas supply system. For example, the gas purge system 150 can be configured to supply purge gas comprising one or more gases. The purge gas can, for example, include $N_2$, or a noble gas (i.e., He, Ne, Ar, Kr, Xe, Rn). Furthermore, the gas purge system can be temperature controlled.

Additionally, referring to FIGS. 2A and 2B, the upper chamber portion 108 can include a temperature-controlled wall that is maintained at an elevated temperature. For example, a wall heating element can be coupled to an upper wall temperature control unit 194, and the wall heating element can be configured to couple to the upper chamber portion 108. The heating element can, for example, comprise a resistive heater element such as a tungsten, nickel-chromium alloy, aluminum-iron alloy, aluminum nitride, etc., filament. Examples of commercially available materials to fabricate resistive heating elements include Kanthal, Nikrothal, and Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe).

When an electrical current flows through the filament, power is dissipated as heat, and, therefore, the upper wall temperature control unit 194 can, for example, comprise a controllable DC power supply. For example, a wall heating element can comprise at least one Firerod cartridge heater commercially available from Watlow (1310 Kingsland Dr., Batavia, Ill., 60510). A cooling element can also be employed in the lower chamber portion. The temperature of the upper chamber portion 108 can be monitored using a temperature-sensing device such as a thermocouple (e.g., a K-type thermocouple, Pt sensor, etc.). Furthermore, a controller can utilize the temperature measurement as feedback to the upper wall temperature control unit 194 in order to control the temperature of the upper chamber portion 108.

Referring still to FIGS. 2A and 2B, pumping systems 125 and 155 can, for example, include a turbo-molecular vacuum pumps (TMP) capable of a pumping speeds of up to about 5000 liters per second (and greater) and a gate valve for throttling the chamber pressure. In conventional vacuum processing devices, about 1000 to about 3000 liter per second TMP is generally employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to process chamber 102. The pressure measuring device can be, for example, a Type 628B Baratron absolute capacitance manometer commercially available from MKS Instruments, Inc. (Andover, Mass.).

Referring again to FIGS. 2A and 2B, processing system 100 includes controller 180 having a microprocessor, memory, and a digital I/O port capable of generating control voltages sufficient to communicate and activate inputs to processing system 100 as well as monitor outputs from processing system 100 such as temperature and pressure sensing devices.

Moreover, controller 180 can be coupled to and can exchange information with substrate holder 130, translation drive system 142, gas injection system 120, pumping system 125, optional (gate) valve drive system 172, lower wall temperature control unit 190, gas distribution system temperature control unit 192, upper wall temperature control unit 194, gas purge system 150, pumping system 155, and heating assembly 160. For example, a program stored in the memory can be utilized to activate the inputs to the aforementioned components of processing system 100 according to a process recipe. One example of controller 180 is a DELL PRECISION WORKSTATION 610™, available from Dell Corporation, Austin, Tex.

Controller 180 can be located locally or remotely relative to the processing system 100. For example, controller 190 can exchange data with processing system 100 using at least one of a direct connection, an intranet, and the Internet. Controller 180 can be coupled to an intranet at, for example, a customer site (i.e., a device maker, etc.), or it can be coupled to an intranet at, for example, a vendor site (i.e., an equipment manufacturer). Additionally, for example, controller 180 can be coupled to the Internet. Furthermore, another computer (i.e., controller, server, etc.) can, for example, access controller 180 to exchange data via at least one of a direct connection, an intranet, the Internet, or a combination thereof.

Furthermore, one or more surfaces of the components comprising the lower chamber portion 104 and the upper chamber portion 108 can be coated with a protective barrier. The protective barrier can comprise at least one of Kapton, Teflon, surface anodization, ceramic spray coating such as alumina, yttria, etc., plasma electrolytic oxidation, etc.

Figure 4A:
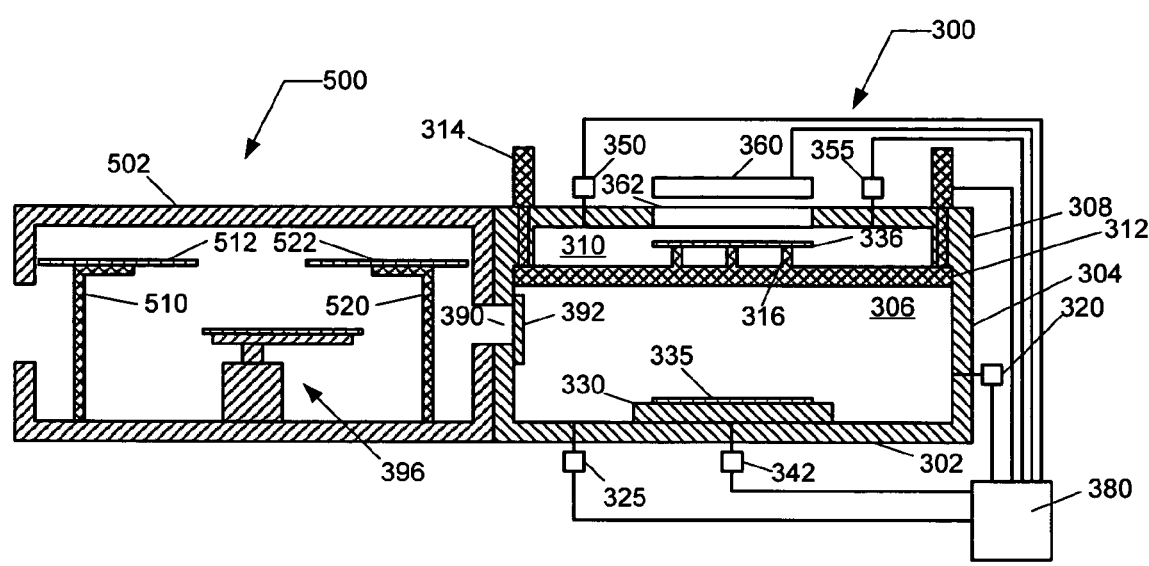
FIGS. 4A, 4B, and 4C show a schematic cross-sectional view of a processing system according to another embodiment of the invention.
Figure 4B:
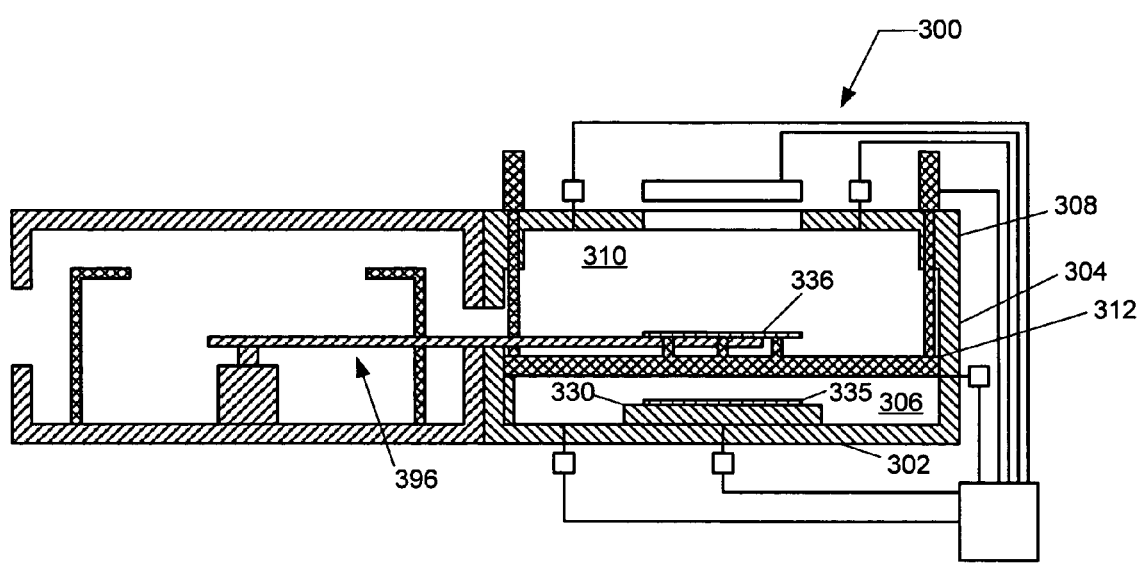
Figure 4C:
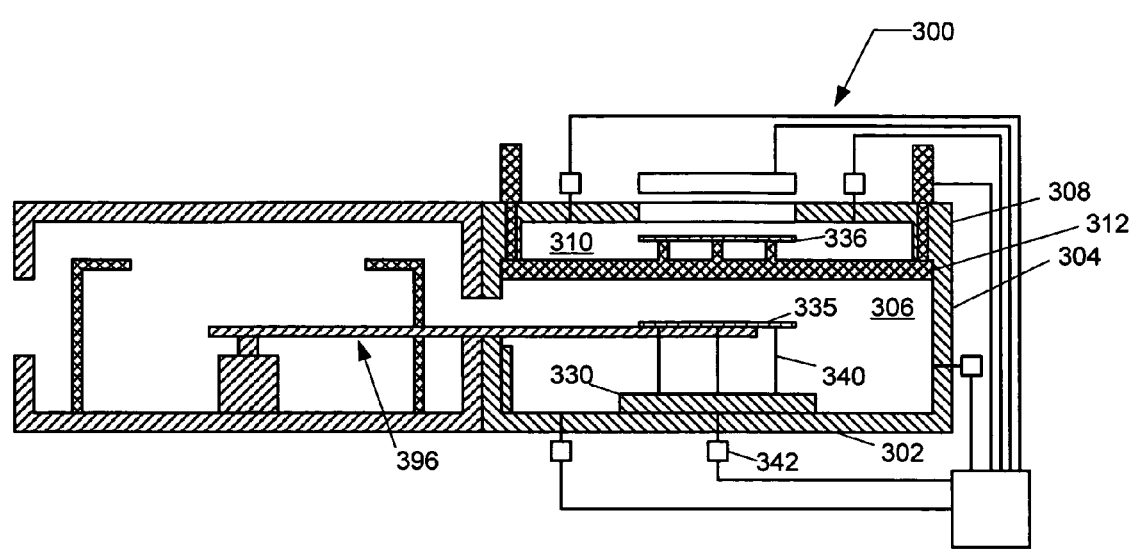

Referring now to FIGS. 4A, 4B, and 4C, a processing system 300 for performing chemical treatment and thermal treatment of a substrate is presented according to another embodiment. Processing system 300 comprises a process chamber 302 having a lower chamber portion 304 for chemically treating a substrate 335 in a chemical treatment space 306, and an upper chamber portion 308 for thermally treating a substrate 336 in a thermal treatment space 310. The lower chamber portion 304 can be temperature-controlled, and the upper chamber portion 308 can be temperature-controlled. The lower chamber portion 304 and upper chamber portion 308 can be isolated from one another using an isolation assembly 312. Isolation assembly 312 is configured to translate vertically upward and downward using translation drive assembly 314. The isolation assembly 312 further includes support elements 316 for supporting substrate 336.

Referring now to FIG. 4A, the lower chamber portion 304 includes a substrate holder 330 configured to support substrate 335. The substrate holder 330 can be configured to heat, cool, or control the temperature of substrate 335. Coupled to substrate holder 330, a substrate lift-pin assembly 340 (see FIG. 4C) is configured to raise and lower substrate 335 from the upper surface of substrate holder 330 using translation drive system 342. Additionally, the lower chamber portion 304 further includes a gas injection system 320 for introducing one or more process gases to the chemical treatment space 306 in the lower chamber portion 304 in order to chemically treat substrate 335, and a pumping system 325 for evacuating the lower chamber portion 304.

Referring still to FIG. 4A, the upper chamber portion 308 includes a heating assembly 360 and thermal window 362, such as a radiant heating assembly, for elevating the temperature of substrate 336. Additionally, the upper chamber portion 308 further includes a gas purge system 350 for introducing purge gas to the thermal treatment space 310 in the upper chamber portion 308, and a pumping system 355 for evacuating the upper chamber portion 308.

Additionally, as shown in FIGS. 4A, 4B, and 4C, the processing system 300 further includes a controller 380 coupled to the processing system, and configured to control the processing system. The controller can be similar to that described above.

Additionally, the processing system 300 further includes a transfer opening 390 through which a substrate can be transferred via a substrate transfer assembly 396, when a gate valve assembly 392 is open. During processing, the transfer opening 390 is sealed closed using gate valve assembly 392 in order to prevent, for example, contamination between the processing system and other systems, such as a transfer system.

As shown in FIGS. 4A and 4B, isolation assembly 312 is configured to receive substrate 336 at a transfer plane (FIG. 4B), translate substrate 336 vertically upward in order to position substrate 336 proximate heating assembly 360, and seal with the upper portion 308 of process chamber 302. As shown in FIGS. 4A and 4C, substrate lift-pin assembly 340 is configured to receive substrate 335 at the transfer plane and translate substrate 335 vertically downward in order to position the substrate 335 on substrate holder 330.

As described above, a film layer on substrate 335 can be trimmed using, for example, a two-step process involving a chemical treatment of the exposed surfaces of the film layer in order to alter the surface chemistry of the film layer, and a thermal treatment of the exposed surfaces of the film layer in order to desorb the altered surface chemistry. As illustrated in FIG. 4C, substrate lift-pin assembly 340 can receive substrate 335 and lower it to substrate holder 330 (in its chemical treatment position), wherein substrate 335 is coupled to the upper surface of substrate holder 330. During this period of time, the lower chamber portion 304 is isolated from the upper chamber portion 308. One or more process gases can be introduced for chemically treating substrate 335 using gas injection system 320, and the lower chamber portion 304 can be evacuated using pumping system 325. Once the chemical treatment process is complete, the substrate lifting assembly 340 can be elevated to the transfer plane, and substrate 335 can be removed for subsequent processing in the upper chamber portion 308. As illustrated in FIG. 4B, the isolation assembly 312 can receive substrate 336 and raise it to its thermal treatment position. Therein, substrate 336 is translated proximate heating assembly 360, wherein it is thermally treated in, for example, an inert atmosphere provided by gas purge system 350 and pumping system 355.

Referring again to FIG. 4A, a transfer system 500 is depicted comprising a transfer chamber 502, and substrate transfer assembly 396 configured to transfer substrates 335, 336 to and from the lower portion 304 of processing system 300 and the upper portion 308 of processing system 300. Additionally, transfer system 500 includes a first holding station 510 coupled to the transfer system 500 and configured to hold a first substrate 512, and a second holding station 520 coupled to the transfer system and configured to hold a second substrate 522.

Figure 5:
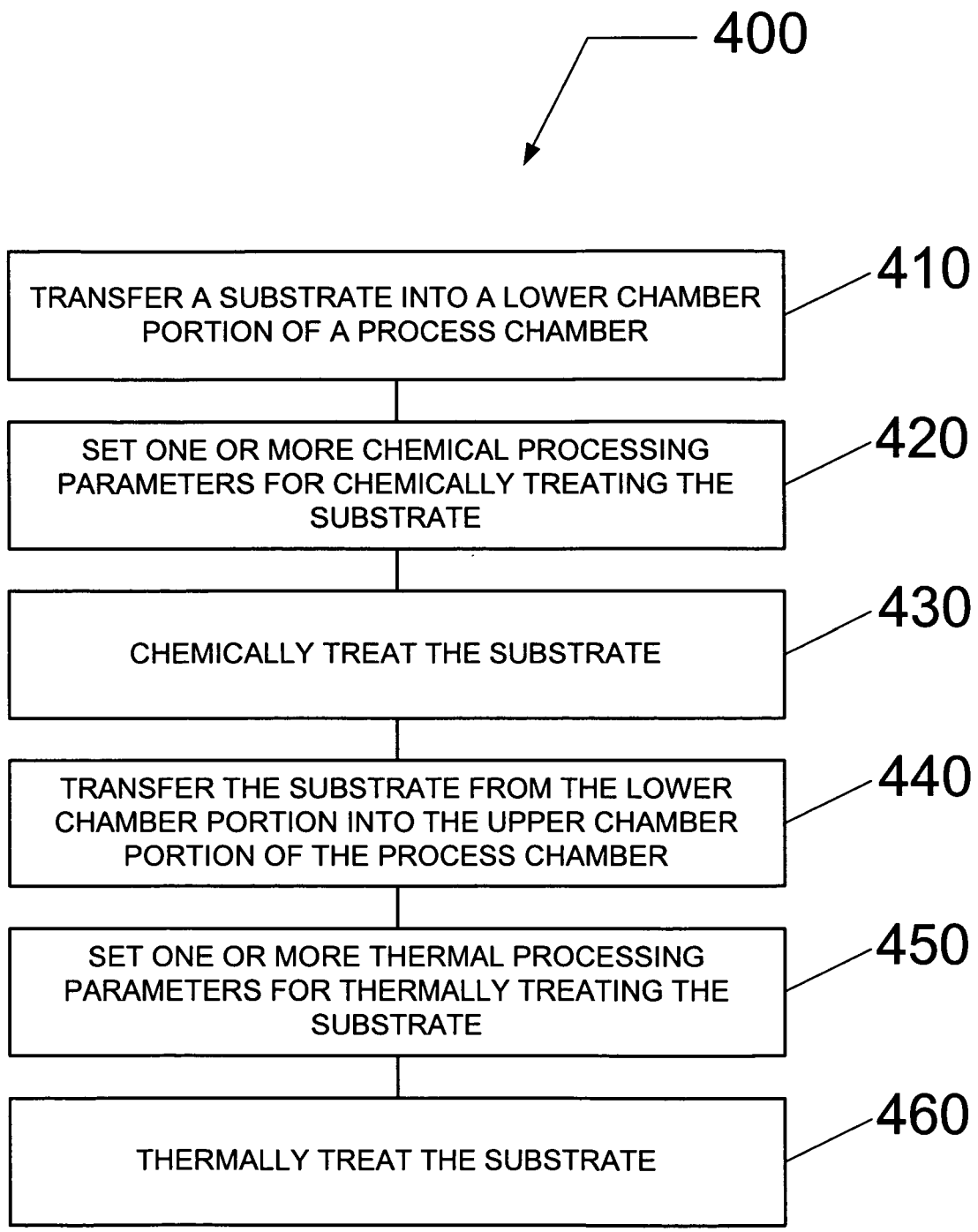
FIG. 5 shows a flow diagram for processing a substrate.

FIG. 5 presents a method of operating the processing system 100 comprising lower chamber portion 104 and upper chamber portion 108. The method is illustrated as a flowchart 400 beginning with task 410 wherein a substrate is transferred to the lower chamber portion 104 using the substrate transfer system. The substrate is received by lift pins that are housed within the substrate holder, and the substrate is lowered to the substrate holder. Thereafter, the substrate is secured to the substrate holder using a clamping system, such as an electrostatic clamping system, and a heat transfer gas is supplied to the backside of the substrate. Additionally, for example, an optional gate valve can be utilized to provide vacuum isolation between the lower chamber portion 104 and the upper chamber portion 108.

In task 420, one or more chemical processing parameters for chemical treatment of the substrate are set. For example, the one or more chemical processing parameters comprise at least one of a chemical treatment processing pressure, a chemical treatment wall temperature, a chemical treatment substrate holder temperature, a chemical treatment substrate temperature, a chemical treatment gas distribution system temperature, and a chemical treatment gas flow rate.

For example, one or more of the following processes may occur: 1) a controller coupled to a lower wall temperature control unit and a first temperature-sensing device is utilized to set a chemical treatment chamber temperature for the chemical treatment chamber; 2) a controller coupled to a gas injection system temperature control unit and a second temperature-sensing device is utilized to set a chemical treatment gas distribution system temperature for the chemical treatment chamber; 3) a controller coupled to at least one temperature control element and a third temperature-sensing device is utilized to set a chemical treatment substrate holder temperature; 4) a controller coupled to at least one of a temperature control element, a backside gas supply system, and a clamping system, and a fourth temperature sensing device in the substrate holder is utilized to set a chemical treatment substrate temperature; 5) a controller coupled to at least one of a vacuum pumping system, and a gas distribution system, and a pressure-sensing device is utilized to set a processing pressure within the chemical treatment chamber; and/or 6) the mass flow rates of the one or more process gases are set by a controller coupled to the one or more mass flow controllers within the gas distribution system.

In task 430, the substrate is chemically treated under the conditions set forth in task 420 for a first period of time. The first period of time can range from about 10 to about 480 seconds, for example.

In task 440, the substrate is transferred from the lower chamber portion 104 to the upper chamber portion 108 via a substrate lifting assembly. For example, the substrate lifting assembly can be as shown in FIGS. 2A and 2B, or as shown in FIGS. 4A, 4B and 4C wherein it includes motions associated with a combination of a substrate lift-pin assembly, a substrate transfer assembly, and an isolation assembly.

In task 450, thermal processing parameters for thermal treatment of the substrate are set. For example, the one or more thermal processing parameters comprise at least one of a thermal treatment wall temperature, a thermal treatment upper assembly temperature, a thermal treatment substrate temperature, a thermal treatment substrate holder temperature, a thermal treatment substrate temperature, and a thermal treatment processing pressure.

For example, one or more of the following processes may occur: 1) a controller coupled to a thermal wall temperature control unit and a first temperature-sensing device in the thermal treatment chamber is utilized to set a thermal treatment wall temperature; 2) a controller coupled to an upper assembly temperature control unit and a second temperature-sensing device in the upper assembly is utilized to set a thermal treatment upper assembly temperature; 3) a controller coupled to a substrate holder temperature control unit and a third temperature-sensing device in the heated substrate holder is utilized to set a thermal treatment substrate holder temperature; 4) a controller coupled to a substrate temperature control unit and a fourth temperature-sensing device in the heated substrate holder and coupled to the substrate is utilized to set a thermal treatment substrate temperature; and/or 5) a controller coupled to a vacuum pumping system, a gas distribution system, and a pressure sensing device is utilized to set a thermal treatment processing pressure within the thermal treatment chamber.

In task 460, the substrate is thermally treated under the conditions set forth in 450 for a second period of time. The second period of time can range from about 10 to about 480 seconds, for example.

In an example, the processing system 100, as depicted in FIGS. 2A and 2B, or FIGS. 4A and 4B, can be a chemical oxide removal system for trimming an oxide hard mask. The processing system 100, 300 comprises lower chamber portion 104, 304 for chemically treating exposed surface layers, such as oxide surface layers, on a substrate, whereby adsorption of the process chemistry on the exposed surfaces affects chemical alteration of the surface layers. Additionally, the processing system 100, 300 comprises upper chamber portion 108, 308 for thermally treating the substrate, whereby the substrate temperature is elevated in order to desorb (or evaporate) the chemically altered exposed surface layers on the substrate.

In the lower chamber portion 104, 304, the chemical treatment space 106, 306 (see FIG. 2A, or 4A) is evacuated, and a process gas comprising HF and $NH_3$ is introduced. Alternately, the process gas can further comprise a carrier gas. The carrier gas can, for example, comprise an inert gas such as argon, xenon, helium, etc. The processing pressure can range from about 1 to about 1000 mTorr and, for example, can typically range from about 2 to about 25 mTorr. The process gas flow rates can range from about 1 to about 2000 sccm for each specie and, for example, typically range from about 10 to about 100 sccm.

Additionally, the lower chamber portion 104, 304 can be heated to a temperature ranging from about 10 to about 200° C. and, for example, the temperature can typically be about 35 to about 200° C. Additionally, the gas injection system can be heated to a temperature ranging from about 10 to about 200° C. and, for example, the temperature can typically be about 40 to about 60° C. The substrate can be maintained at a temperature ranging from about 10 to about 50° C. and, for example, the substrate temperature can typically be about 25 to about 30° C.

In the upper chamber portion 108, 308, the thermal treatment space 110, 310 (see FIG. 2B, or 4B) is evacuated, and a purge gas comprising $N_2$ is introduced. The processing pressure can range from about 1 to about 1000 mTorr and, for example, can typically range from about 2 to about 25 mTorr. The purge gas flow rates can range from about 1 to about 2000 sccm for each specie and, for example, typically range from about 10 to about 100 sccm.

In the upper chamber portion 108, 308, the wall can be heated to a temperature ranging from about 20 to about 200° C. and, for example, the temperature can typically be about 75 to about 100° C. Additionally, the gas purge system can be heated to a temperature ranging from 20 to about 200° C. and, for example, the temperature can typically be about 75 to about 100° C. The substrate can be heated to a temperature in excess of about 100° C. ranging from about 100 to about 200° C., and, for example, the temperature can typically be about 100 to about 150° C.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is meant or intended to, in any way, limit the invention—rather the scope of the invention is defined by the appended claims.

What is claimed is:

1. A processing system for trimming a feature on a substrate comprising:
   a process chamber having a lower chamber portion that chemically alters exposed surface layers on a substrate, and an upper chamber portion that thermally treats said chemically altered surface layers on said substrate;
   a lower wall temperature control unit coupled to said lower chamber portion and configured to control the temperature of said lower chamber portion;
   an upper wall temperature control unit coupled to said upper chamber portion and configured to control the temperature of said upper chamber portion;
   a gas injection system coupled to said lower chamber portion and configured to introduce one or more process gases to said lower chamber portion;
   a gas distribution system temperature control unit coupled to said gas injection system and configured to control the temperature of said gas injection system;
   a temperature controlled substrate holder fixedly mounted within said lower chamber portion and configured to support said substrate on an upper surface thereof in said lower chamber portion and control a temperature of said substrate when in contact with said temperature controlled substrate holder;
   a substrate lift-pin assembly coupled to said temperature controlled substrate holder, and configured to vertically translate said substrate between said upper surface of said temperature controlled substrate holder and a transfer plane in said lower chamber portion;
   a substrate lifting assembly, separate from said temperature controlled substrate holder, movably coupled to said process chamber, and configured to recede beneath said upper surface of said temperature-controlled substrate holder, isolate said lower chamber portion from said upper chamber portion via a chamber lip, support said substrate on a substrate lip at a peripheral edge of said substrate and transport said substrate between said lower chamber portion and said upper chamber portion, to and from said transfer plane, and to and from said upper surface of said temperature-controlled substrate holder; and
   a pumping system coupled to said lower chamber portion and said upper chamber portion.

2. The processing system of claim 1, wherein said lower chamber portion is thermally insulated from said upper chamber portion.

3. The processing system of claim 2, wherein said thermal insulation comprises a thermal insulation plate.

4. The processing system of claim 3, wherein said thermal insulation plate provides a thermal barrier between said lower chamber portion and said upper chamber portion.

5. The processing system of claim 4, wherein said thermal insulation plate comprises at least one of Teflon, alumina, sapphire, and quartz.

6. The processing system of claim 1, wherein said lower chamber portion is vacuum isolated from said upper chamber portion.

7. The processing system of claim 6, wherein said vacuum isolation includes a gate valve for opening and closing an opening between said lower chamber portion and said upper chamber portion.

8. The processing system of claim 1, wherein said temperature controlled substrate holder comprises at least one of an electrostatic clamping system, a back-side gas supply system, and one or more temperature control elements.

9. The processing system of claim 1, wherein said temperature controlled substrate holder in said lower chamber portion includes one or more temperature control elements and said one or more temperature control elements comprise at least one of a cooling channel, a heating channel, a resistive heating element, a radiant lamp, and a thermo-electric device.

10. The processing system of claim 1, wherein said gas injection system comprises at least one gas distribution plenum.

11. The processing system of claim 1, wherein said gas injection system comprises one or more gas injection orifices.

12. The processing system of claim 1, wherein said one or more process gases comprises a first gas and a second gas different from said first gas.

13. The processing system of claim 1, wherein said one or more process gases comprise at least one of HF and $NH_3$.

14. The processing system of claim 13, wherein said one or more process gases further includes an inert gas.

15. The processing system of claim 14, wherein said inert gas includes a Noble gas.

16. The processing system of claim 1, wherein said upper chamber portion comprises:
   a heating assembly configured to elevate the temperature of said substrate, and
   a gas purge system configured to introduce a purge gas to said upper chamber portion.

17. The processing system of claim 16, wherein said heating assembly includes a radiant heating assembly.

18. The processing system of claim 17, wherein said radiant heating assembly includes an array of radiant lamps.

19. The processing system of claim 16, wherein said purge gas includes $N_2$.

20. The processing system of claim 1, wherein said substrate lifting assembly locates said substrate on said temperature-controlled substrate holder in said lower chamber portion for exposure to said one or more process gases when in a lowered position, and locates said substrate proximate a heating assembly in said upper chamber portion when in a raised position.

21. The processing system of in claim 1, wherein said process chamber is coupled to a manufacturing system.

* * * * *